(12) United States Patent
Sung (10) Patent No.: US 12,431,867 B2
(45) Date of Patent: Sep. 30, 2025

(54) ACOUSTIC WAVE FILTER

(71) Applicant: SAMSUNG ELECTRO-MECHANICS CO., LTD., Suwon-si (KR)

(72) Inventor: Jungwoo Sung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 237 days.

(21) Appl. No.: 18/322,233

(22) Filed: May 23, 2023

(65) Prior Publication Data

US 2024/0195388 A1 Jun. 13, 2024

(30) Foreign Application Priority Data

Dec. 8, 2022 (KR) .................. 10-2022-0170881

(51) Int. Cl.
*H03H 9/60* (2006.01)
*H03H 9/00* (2006.01)
*H03H 9/02* (2006.01)

(52) U.S. Cl.
CPC .......... *H03H 9/605* (2013.01); *H03H 9/0014* (2013.01); *H03H 9/02015* (2013.01)

(58) Field of Classification Search
CPC .......... H03H 9/02; H03H 9/568; H03H 9/605; H03H 9/6483; H03H 17/0285
USPC ................................................. 333/186, 193
See application file for complete search history.

(56) References Cited

U.S. PATENT DOCUMENTS

| 10,333,494 B2 | 6/2019 | Khlat et al. |
| 2010/0007438 A1 | 1/2010 | Lee et al. |
| 2015/0222246 A1 | 8/2015 | Nosaka |
| 2016/0359469 A1* | 12/2016 | Ellä ...................... H03H 9/6483 |
| 2017/0126197 A1* | 5/2017 | Fritz ...................... H03H 7/175 |
| 2017/0250667 A1 | 8/2017 | Cheon |
| 2022/0029646 A1* | 1/2022 | Abramov ............. H04B 1/0057 |
| 2022/0247383 A1 | 8/2022 | Guyette |
| 2022/0263485 A1 | 8/2022 | He et al. |

FOREIGN PATENT DOCUMENTS

| JP | 5896039 B2 | 3/2016 |
| KR | 10-0714614 B1 | 5/2007 |
| KR | 10-2017-0101438 A | 9/2017 |
| KR | 10-2021-0141914 A | 11/2021 |

OTHER PUBLICATIONS

Korean Office Action issued on Jun. 13, 2024, in counterpart Korean Patent Application No. 10-2022-0170881 (5 pages in English, 5 pages in Korean).
Korean Office Action issued on Dec. 30, 2024, in counterpart Korean Patent Application No. 10-2022-0170881 (1 page in English, 2 pages in Korean).

* cited by examiner

*Primary Examiner* — Rakesh B Patel
(74) *Attorney, Agent, or Firm* — NSIP Law (57) ABSTRACT

An acoustic wave filter includes a first ladder filter, connected between a first port and a second port, including a first series resonator and a first shunt resonator; a first filter, connected between the first port and a first terminal of the first ladder filter, including a first inductor and a first capacitor connected in series to each other; and a second filter, connected between a second terminal of the first ladder filter and the second port, including a second inductor and a second capacitor connected in series to each other.

13 Claims, 10 Drawing Sheets

ACOUSTIC WAVE FILTER

CROSS-REFERENCE TO RELATED APPLICATION

This application claims the benefit under 35 USC § 119(a) of Korean Patent Application No. 10-2022-0170881, filed on Dec. 8, 2022, in the Korean Intellectual Property Office, the entire disclosure of which is incorporated herein by reference for all purposes.

BACKGROUND

1. Field

The present disclosure relates to an acoustic wave filter.

2. Description of the Related Art

Devices such as mobile communication devices, chemical devices, and biodevices include lightweight filters, oscillators, resonance elements, acoustic resonant mass sensors, and the like.

An acoustic wave filter, including a bulk acoustic wave (BAW) filter, is relatively small and inexpensive compared to a dielectric filter, a metal cavity filter, a waveguide, and the like. Since the BAW filter has good performance (e.g., a wide pass bandwidth) despite its small size, it is widely used in a communication module of a mobile device.

The BAW filter in the communication module typically uses a ladder filter type. A basic ladder-type BAW filter uses a series resonator and a shunt resonator having a different resonant frequency. In an example where the resonant frequency of the shunt resonator is lower than that of the series resonator, the BAW filter has a large amount of signal attenuation at an adjacent frequency of the pass band.

A bandpass filter may perform well when it has a small insertion loss in a pass band and a high rejection characteristic in a cutoff band.

In addition, a wideband filter is required to increase the communication speed of a current communication module.

Therefore, a filter having a wide bandwidth, a low insertion loss in a passband, and a high rejection characteristic in a cutoff band are desirable.

The above information disclosed in this Background section is only for the enhancement of understanding of the background of the disclosure, and therefore it may contain information that does not constitute prior art or knowledge.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave filter includes a first ladder filter, connected between a first port and a second port, including a first series resonator and a first shunt resonator; a first filter, connected between the first port and a first terminal of the first ladder filter, including a first inductor and a first capacitor connected in series to each other; and a second filter, connected between a second terminal of the first ladder filter and the second port, including a second inductor and a second capacitor connected in series to each other.

Each of the first filter and the second filter may include a bandpass filter.

The first inductor and the second inductor may have mutual inductance with each other.

The acoustic wave filter may further include a second ladder filter, connected between the first ladder filter and the second port, including a second series resonator and a second shunt resonator; a third filter, connected between the second terminal of the first ladder filter and a first terminal of the second ladder filter, including a third inductor and a third capacitor connected in series to each other; and a fourth filter, connected between a second terminal of the second ladder filter and the second port, including a fourth inductor and a fourth capacitor connected in series to each other The third inductor and the fourth inductor may have mutual inductance with each other.

The first series resonator and the first shunt resonator may have a piezoelectric characteristic, and the acoustic wave filter may include a bulk acoustic wave filter.

In another general aspect, an acoustic wave filter include a first series resonator connected between a first port and a second port; a first shunt resonator connected between a first node, disposed between the first port and the second port, and a ground; a first bandpass filter, including a first inductor and a first capacitor connected in series to each other between the first port and the first series resonator; and a second bandpass filter, including a second inductor and a second capacitor connected in series to each other between the first series resonator and the second port.

The first inductor and the second inductor may have mutual inductance with each other.

The acoustic wave filter may further include a second series resonator connected between the first series resonator and the second port; a second shunt resonator, connected between a ground and a second node, disposed between the second bandpass filter and the second port; a third bandpass filter, including a third inductor and a third capacitor connected in series to each other between the second bandpass filter and the second node; and a fourth bandpass filter including a fourth inductor and a fourth capacitor connected in series to each other between the second series resonator and the second port.

The third inductor and the fourth inductor may have mutual inductance with each other.

In another general aspect, an acoustic wave filter includes a plurality of filters connected between a first port and a second port, wherein each of the plurality of filters comprises an inductor and a capacitor connected in series to each other; a plurality of ladder filters connected between the first port and the second port, wherein each of the plurality of ladder filters comprises a series resonator and a shunt resonator, and each of the plurality of ladder filters is connected between different adjacent ones of the plurality of filters; and each terminal of terminals of the plurality of filters is connected to one of the first port, the second port, a terminal of one of the plurality of ladder filters, or a terminal of an adjacent one of the plurality of filters.

Each of the plurality of filters may include a bandpass filter.

Mutual inductance may exist between inductors of adjacent ones of the plurality of filters.

The series resonator and the shunt resonator may have a piezoelectric effect.

The acoustic wave filter may be a bulk acoustic wave (BAW) filter.

Other features and aspects will be apparent from the following detailed description, the drawings, and the claims.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

Throughout the specification, a radio frequency (RF) signal includes Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but are not limited thereto.

One or more embodiments may provide an acoustic wave filter having a low insertion loss and a high rejection characteristic in a cutoff band may be provided.

Figure 1:
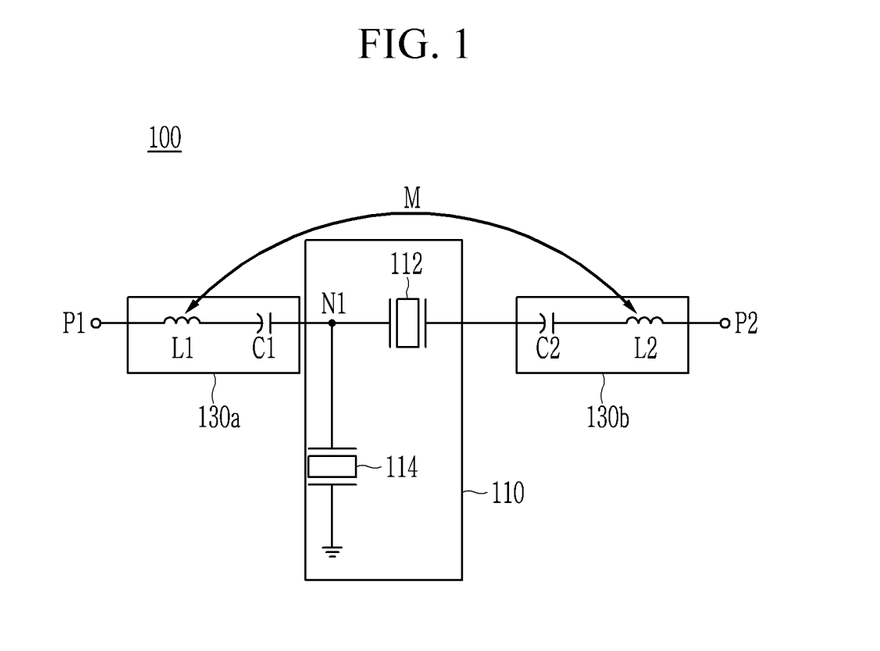
FIG. 1 is a circuit diagram illustrating an acoustic wave filter according to one or more embodiments.

FIG. 1 is a circuit diagram illustrating an acoustic wave filter according to one or more embodiments.

Referring to FIG. 1, an acoustic wave filter 100, according to the embodiment, may pass (or transmit) a main frequency band of a radio frequency (RF) signal input to a port P1 to output the main frequency band to a port P2.

The acoustic wave filter 100 may include a ladder filter 110, a first bandpass filter 130a, and a second bandpass filter 130b.

The ladder filter 110 may include a series resonator 112 and a shunt resonator 114.

The series resonator 112 may be connected in series between the port P1 and the port P2. The closer the frequency of the RF signal is to a resonant frequency of the series resonator 112, the higher the pass rate of the RF signal between the port P1 and the port P2. The closer the frequency of the RF signal is to an anti-resonance frequency of the series resonator 112, the lower the pass rate of the RF signal between the port P1 and the port P2.

The shunt resonator 114 may be connected between a node N1 between the first port P1 and the series resonator 112 and a ground. As an example, the shunt resonator 114 may be connected between a node N1, between the second port P2 and the series resonator 112, and the ground. The closer the frequency of the RF signal is to a resonant frequency of the shunt resonator 114, the higher the pass rate of the RF signal between the node N1 and the ground. The closer the frequency of the RF signal is to an anti-resonance frequency of the shunt resonator 114, the lower the pass rate of the RF signal between the node N1 and the ground.

The resonant frequency of the series resonator 112 may be set higher than the resonant frequency of the shunt resonator 114. In addition, since the anti-resonant frequency is higher than the resonant frequency, the ladder filter 110, including the series resonator 112 and the shunt resonator 114, may have a pass bandwidth provided by the lowest frequency corresponding to the resonant frequency of the shunt resonator 114 and the highest frequency corresponding to the anti-resonance frequency of the series resonator 112. The pass bandwidth may be wider as a difference between the resonant frequency of the shunt resonator 114 and the anti-resonant frequency of the series resonator 112 increases; however, if the difference is too large, the pass bandwidth may split.

In the acoustic wave filter 100, the series resonator 112 and the shunt resonator 114 may have a piezoelectric property. The acoustic wave filter 100 may be a bulk acoustic wave (BAW) filter.

Although FIG. 1 shows the ladder filter 110, including one series resonator 112 and one shunt resonator 114, the ladder filter 110 may include a plurality of series resonators and/or a plurality of shunt resonators. In a ladder filter corresponding to one example, a plurality of series resonators may be connected in series between the port P1 and the port P2, a shunt resonator may be connected between the port P1 and the ground, and a shunt resonator may be connected between the port P2 and the ground.

In the acoustic wave filter 100, a difference between a resonant frequency and an anti-resonant frequency of a resonator may be determined based on an electromechanical coupling factor ($kt^2$), a physical characteristic of the resonator. When the size or shape of the resonator is changed, the resonant frequency and the anti-resonant frequency may also change.

According to one or more embodiments, the first bandpass filter 130a and the second bandpass filter 130b may be connected to both terminals of the ladder filter 110. A pass band of the ladder filter 110 may be further widened using the first bandpass filter 130a and the second bandpass filter 130b.

The first bandpass filter 130a may be connected between the first port P1 and the series resonator 112. The first bandpass filter 130a may include an inductor L1 and a capacitor C1 connected in series to each other between the first port P1 and the series resonator 112. Positions of the inductor L1 and the capacitor C1 may be interchanged. From another point of view, the first bandpass filter 130a may be connected between the first port P1 and a first terminal (or a first end) of the ladder filter 110.

The first bandpass filter 130a, including the inductor L1 and the capacitor C1 connected in series with each other, may pass a signal component around a resonant frequency, and the resonant frequency ($f_z$) of the first bandpass filter 130a may be expressed by Equation 1.

$$f_z = \frac{1}{2\pi\sqrt{LC}} \qquad \text{Equation 1}$$

As shown in Equation 1, the resonant frequency ($f_z$) of the first bandpass filter 130a may be determined by the inductor L1 and the capacitor C1.

Since the first bandpass filter 130a has a bandpass characteristic, the first bandpass filter 130a may set the resonant frequency ($f_z$) of the first bandpass filter 130a through the inductor L1 and the capacitor C1 to widen a pass band of the ladder filter 110.

The second bandpass filter 130b may be connected between the series resonator 112 and the second port P2. The second bandpass filter 130b may include an inductor L2 and a capacitor C2 connected in series to each other between the series resonator 112 and the second port P2. Positions of the inductor L2 and the capacitor C2 may be interchanged. From another point of view, the second bandpass filter 130b may be connected between a second terminal of the ladder filter 110 and the second port P2. The second bandpass filter 130b, including the inductor L2 and the capacitor C2 connected in series to each other, may pass only a signal component around a resonant frequency. As shown in Equation 1, the resonant frequency of the second bandpass filter 130b may be determined by the inductor L2 and the capacitor C2.

Since the second bandpass filter 130b has a bandpass characteristic, the second bandpass filter 130b may set the resonant frequency ($f_z$) of the second bandpass filter 130b through the inductor L2 and the capacitor C2 to widen the pass band of the ladder filter 110.

In this case, the inductor L1 of the first bandpass filter 130a and the inductor L2 of the second bandpass filter 130b may be coupled to each other. When the inductor L1 of the first bandpass filter 130a and the inductor L2 of the second bandpass filter 130b are mutually coupled by a coupling coefficient M, through mutual inductance due to mutual coupling between the inductor L1 and the inductor L2, the acoustic wave filter 100 may have a small insertion loss in a pass band and an excellent rejection characteristic (or an excellent attenuation characteristic) in a cutoff band.

An effect exhibited by the acoustic wave filter 100 will be described in detail based on simulation results shown in FIGS. 2 to 4.

Figure 2:
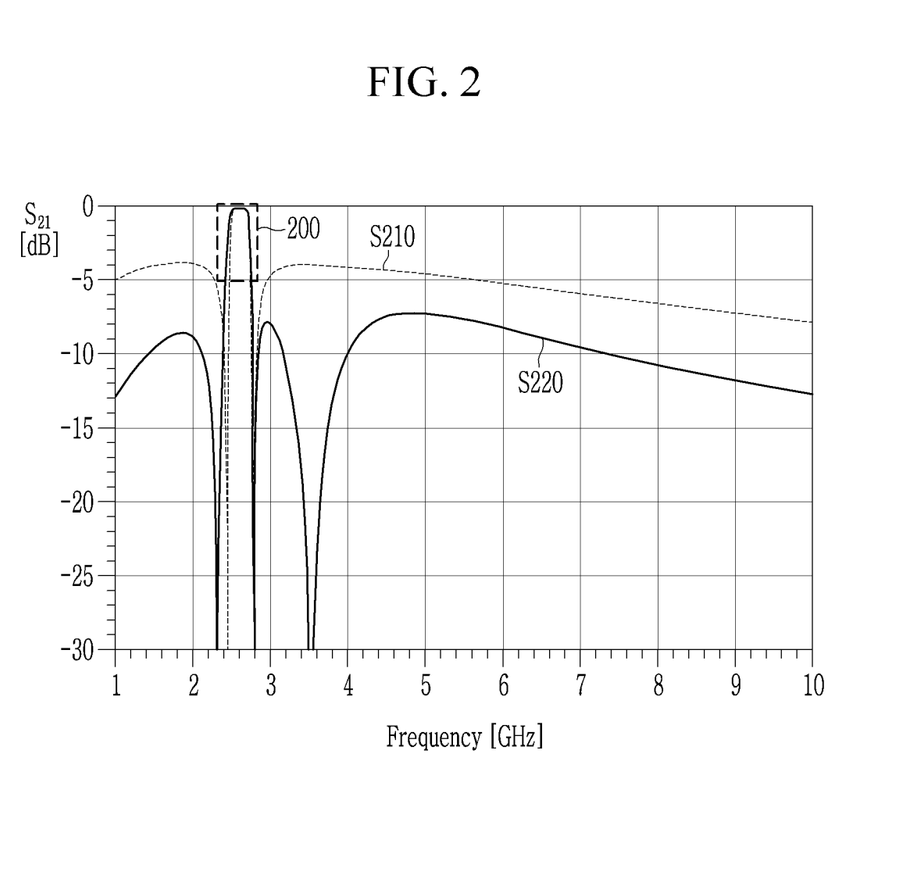
FIG. 2 shows a simulation result of an insertion loss of the acoustic wave filter of the embodiment shown in FIG. 1 and a simulation result of an insertion loss of an acoustic wave filter according to a comparative example.

FIG. 2 shows a simulation result of an insertion loss of the acoustic wave filter of the embodiment shown in FIG. 1 and a simulation result of an insertion loss of an acoustic wave filter according to a comparative example. FIG. 3 is an enlarged view of a partial section in the simulation result of the insertion loss shown in FIG. 2. FIG. 4 shows a simulation result of a reflection loss of the acoustic wave filter of the embodiment shown in FIG. 1 and a simulation result of a reflection loss of the acoustic wave filter of the comparative example.

Figure 3:
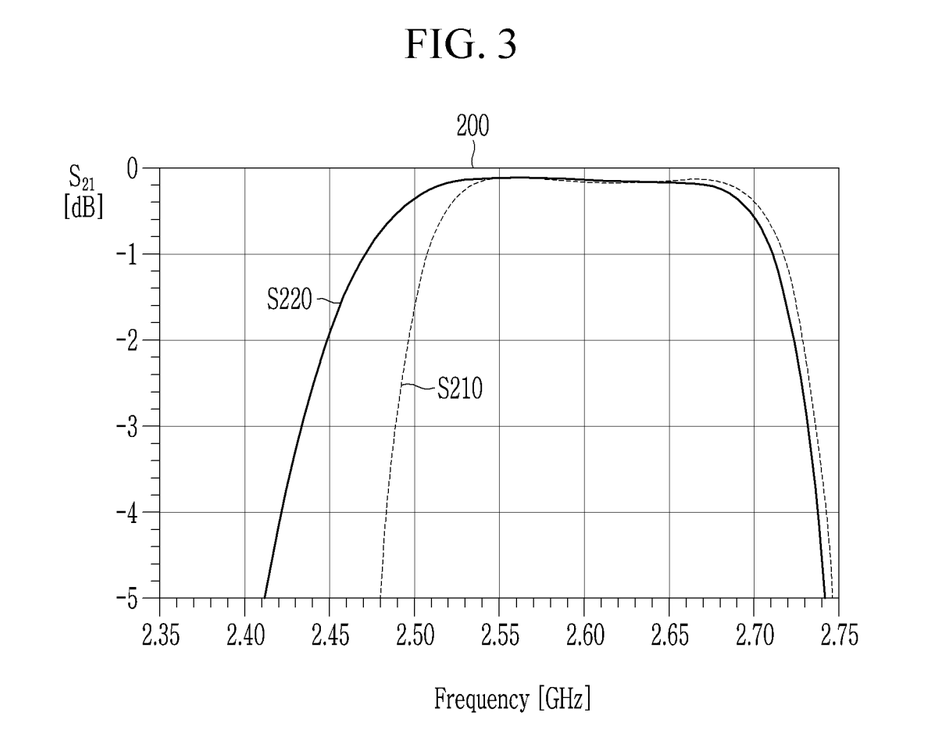
FIG. 3 is an enlarged view of a partial section in the simulation result of the insertion loss shown in FIG. 2.

In FIG. 2, the partial section 200 represents the insertion loss of a range of 0 dB to −5 dB for an entire frequency band, and the partial section 200 is enlarged in FIG. 3.

Figure 4:
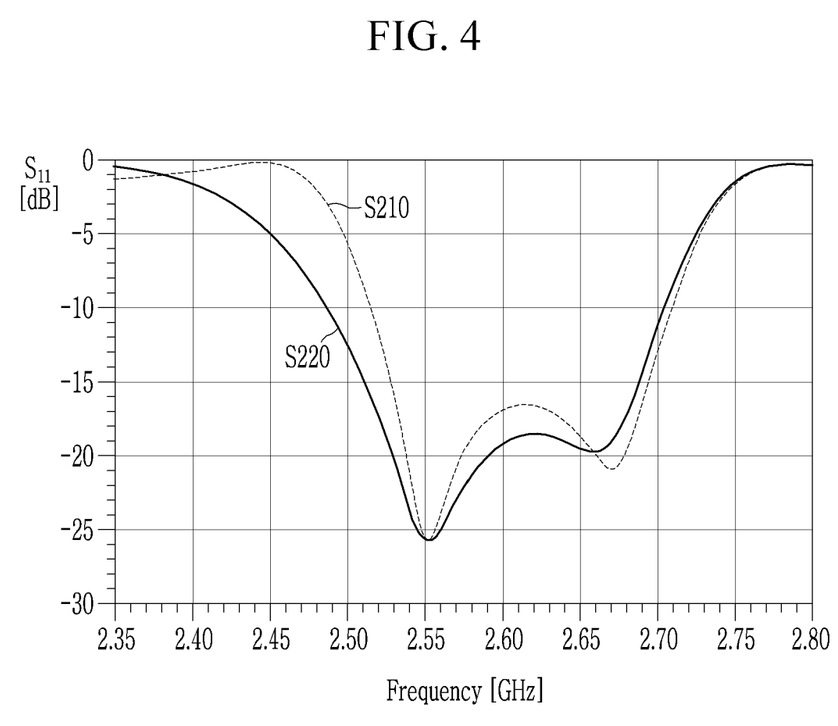
FIG. 4 shows a simulation result of a reflection loss of the acoustic wave filter of the embodiment shown in FIG. 1 and a simulation result of a reflection loss of the acoustic wave filter of the comparative example.
Figure 5:
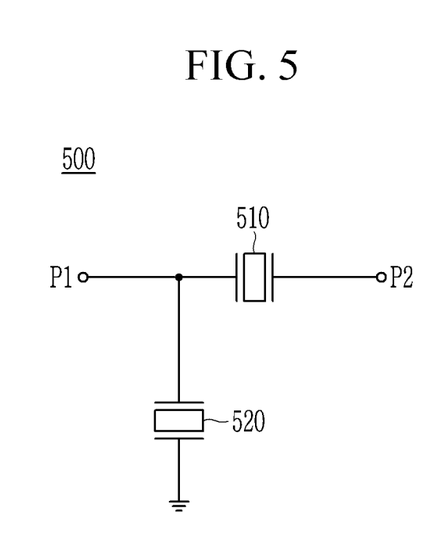
FIG. 5 is a circuit diagram showing the acoustic wave filter of the comparative example.

In FIGS. 2 to 4, the comparative example S210 is a ladder filter with the same structure as FIG. 5.

FIG. 5 is a circuit diagram showing the acoustic wave filter of the comparative example.

As shown in FIG. 5, the acoustic wave filter 500 of the comparative example S210 includes one series resonator 510 and one shunt resonator 520, and has a structure without the first bandpass filter 130a and the second bandpass filter 130b of the acoustic wave filter 100 of FIG. 1.

First, referring to FIG. 2, it may be seen that the embodiment S220 shown in FIG. 1 has a better frequency rejection characteristic (or a better frequency attenuation characteristic) outside the pass band than the comparative example S210 because of the first bandpass filter 130a and the second bandpass filter 130b.

Referring to FIG. 3, it may be seen that a pass bandwidth of the embodiment S220 shown in FIG. 1 is wider than that of the comparative example S210 because of the first bandpass filter 130a and the second bandpass filter 130b.

In addition, referring to FIG. 4, it may be seen that the embodiment S220 shown in FIG. 1 has a lower reflection loss in the pass band than the comparative example S210 because of the first bandpass filter 130a and the second bandpass filter 130b.

Thus, the acoustic wave filter 100 shown in FIG. 1 may connect the first bandpass filter 130a and the second bandpass filter 130b to both terminals of the ladder filter 110 so that it has a wide bandwidth, a low insertion loss in the pass band, and a high rejection characteristic in the cutoff band.

Figure 6:
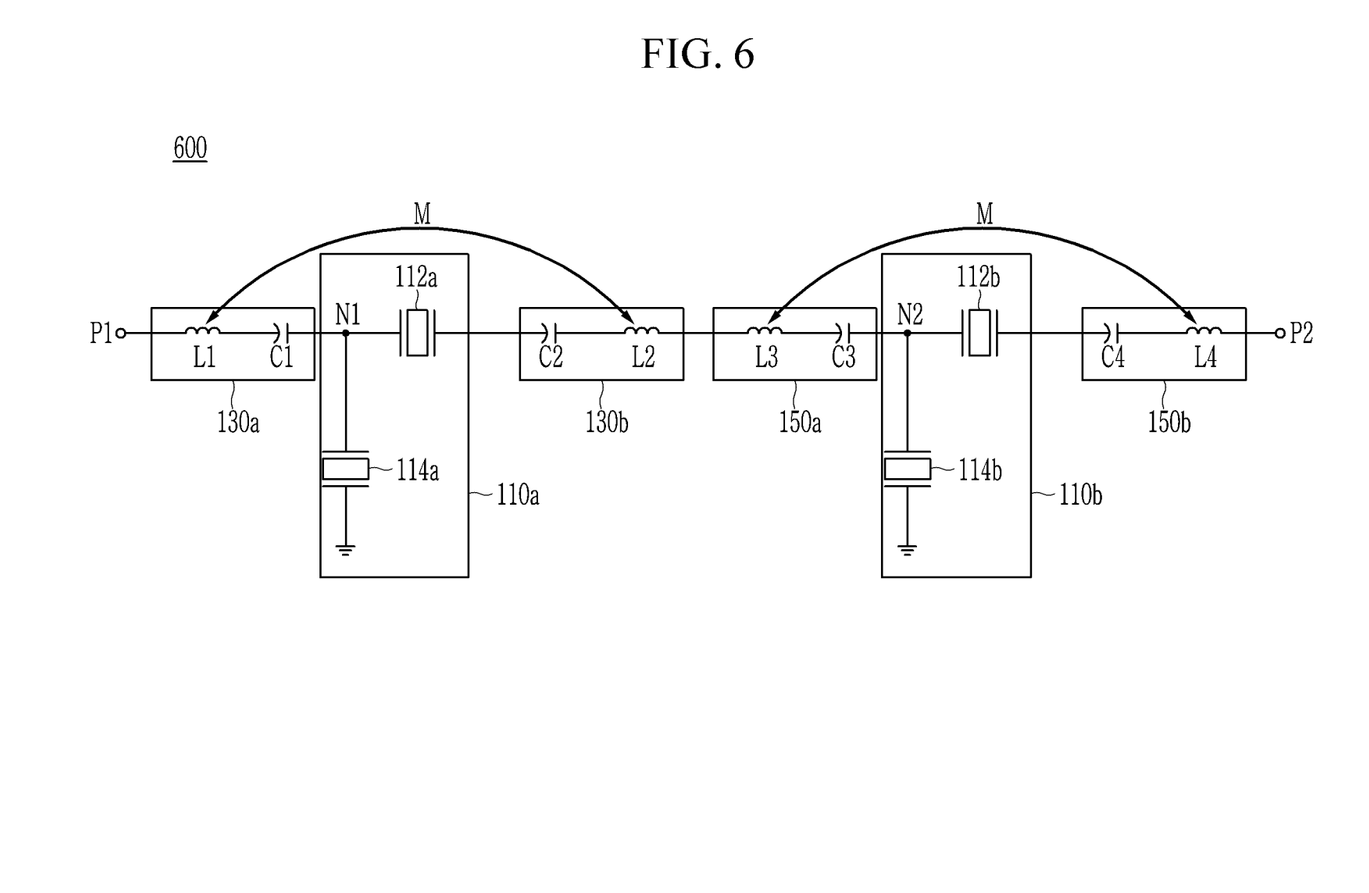
FIG. 6 is a circuit diagram illustrating an acoustic wave filter according to another one or more embodiments.

FIG. 6 is a circuit diagram illustrating an acoustic wave filter according to another one or more embodiments.

Referring to FIG. 6, the acoustic wave filter 600, according to the other embodiment, may include a first ladder filter 110a, a second ladder filter 110b, a first bandpass filter 130a, a second bandpass filter 130b, a third bandpass filter 150a, and a fourth bandpass filter 150b.

The first ladder filter 110a and the second ladder filter 110b may be connected to each other between a port P1 and a port P2.

The first bandpass filter 130a and the second bandpass filter 130b may be connected to both terminals of the first ladder filter 110a, respectively. That is, the first bandpass filter 130a may be connected between the port P1 and a first terminal of the first ladder filter 110a, and the second bandpass filter 130b may be connected between a second terminal of the first ladder filter 110a and a first terminal of the second ladder filter 110b.

The third bandpass filter 150a and the fourth bandpass filter 150b may be connected to both terminals of the second ladder filter 110b, respectively. That is, the third bandpass filter 150a may be connected between the second terminal of the first ladder filter 110a and the first terminal of the second ladder filter 110b, and the fourth bandpass filter 150b may be connected between a second terminal of the second ladder filter 110b and the port P2.

The first bandpass filter 130a may include an inductor L1 and a capacitor C1 connected in series to each other. The second bandpass filter 130b may include an inductor L2 and a capacitor C2 connected in series to each other. The inductor L1 of the first bandpass filter 130a and the inductor L2 of the second bandpass filter 130b may be mutually coupled by a coupling coefficient M.

The third bandpass filter 150a may include an inductor L3 and a capacitor C3 connected in series to each other. The fourth bandpass filter 150b may include an inductor L4 and a capacitor C4 connected in series to each other. The inductor L3 of the third bandpass filter 150a and the inductor L4 of the fourth bandpass filter 150b may be mutually coupled by a coupling coefficient M.

Although only first and second ladder filters 110a and 110b are shown in FIG. 6, three or more ladder filters may be connected in series between the port P1 and the port P2, and bandpass filters may be connected in series at both terminals of each ladder filter.

An effect exhibited by the acoustic wave filter 600 shown in FIG. 6 will be described in detail based on simulation results shown in FIGS. 7 to 9.

Figure 7:
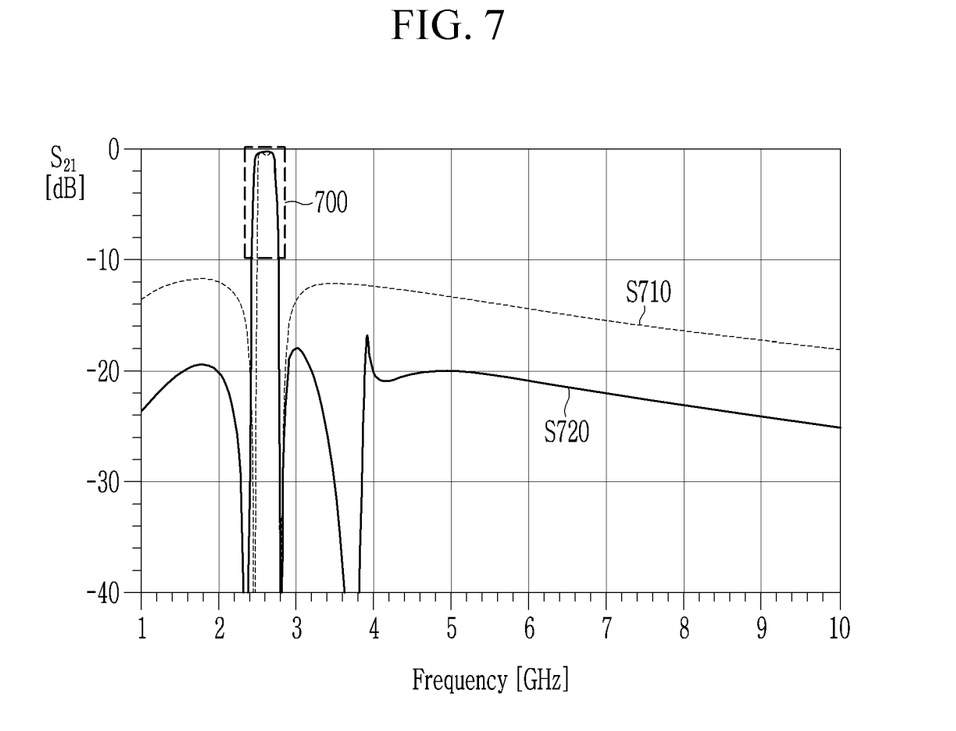
FIG. 7 shows a simulation result of an insertion loss of the acoustic wave filter of the embodiment shown in FIG. 6 and a simulation result of an insertion loss of an acoustic wave filter of a comparative example.

FIG. 7 shows a simulation result of an insertion loss of the acoustic wave filter of the embodiment shown in FIG. 6 and a simulation result of an insertion loss of an acoustic wave filter of a comparative example. FIG. 8 is an enlarged view of a partial section in the simulation result for the insertion loss shown in FIG. 6. FIG. 9 is a view showing a simulation result of a reflection loss of the acoustic wave filter of the embodiment shown in FIG. 6 and a simulation result of a reflection loss of the acoustic wave filter of the comparative example.

Figure 8:
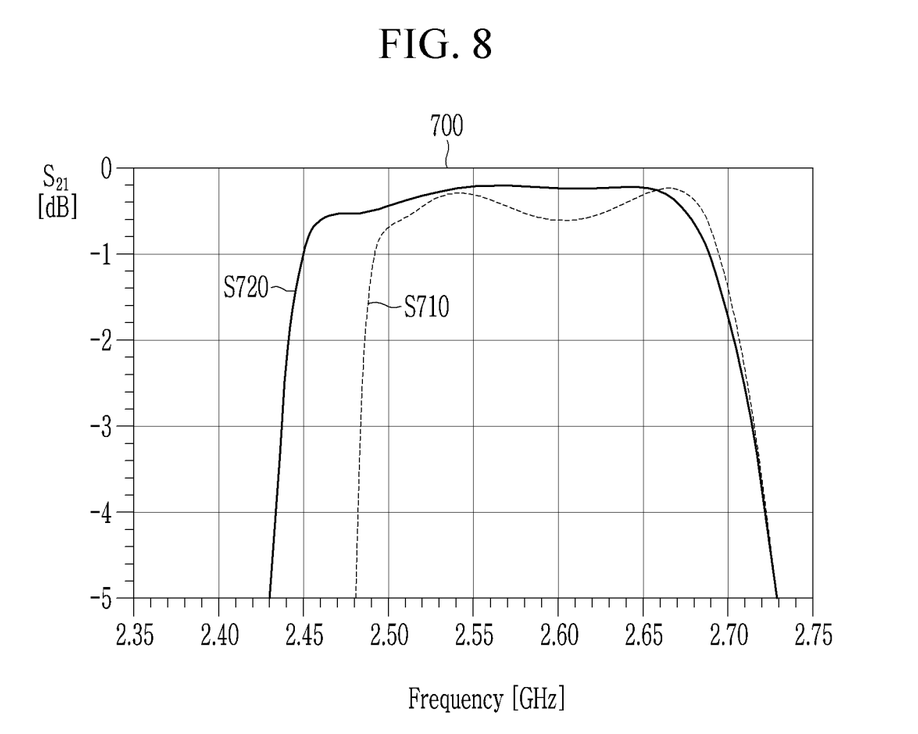
FIG. 8 is an enlarged view of a partial section in the simulation result for the insertion loss shown in FIG. 6.

In FIG. 7, the partial section 700 represents the insertion loss in a range from 0 dB to −5 dB for an entire frequency band, and the partial section 700 is enlarged in FIG. 8.

Figure 9:
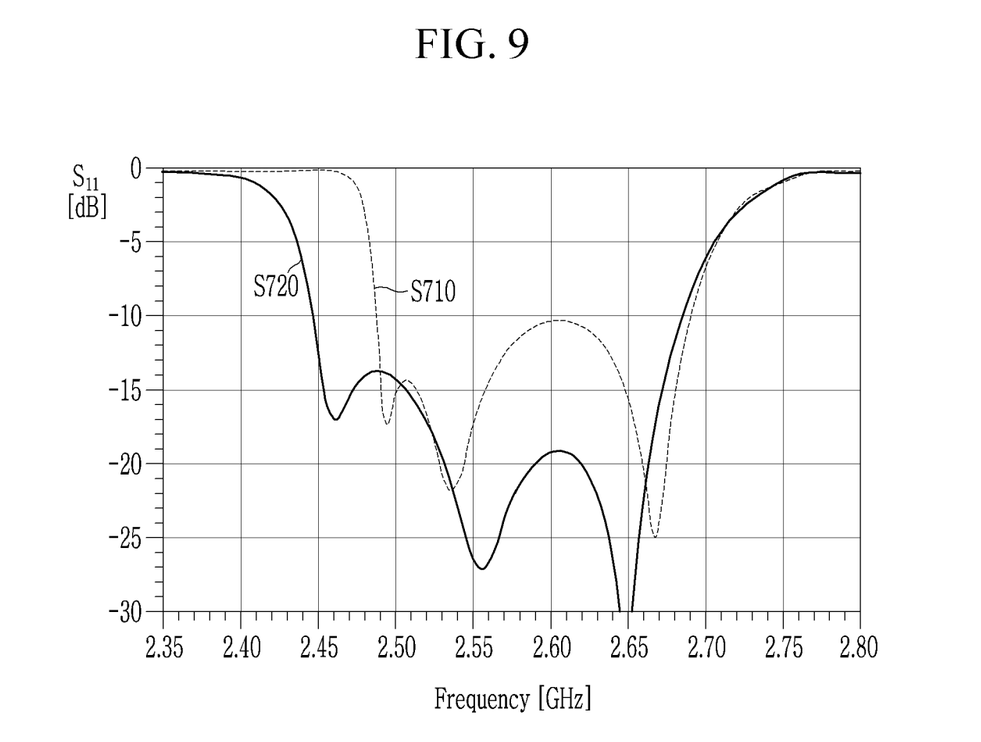
FIG. 9 shows a simulation result of a reflection loss of the acoustic wave filter of the embodiment shown in FIG. 6 and a simulation result of a reflection loss of the acoustic wave filter of the comparative example.
Figure 10:
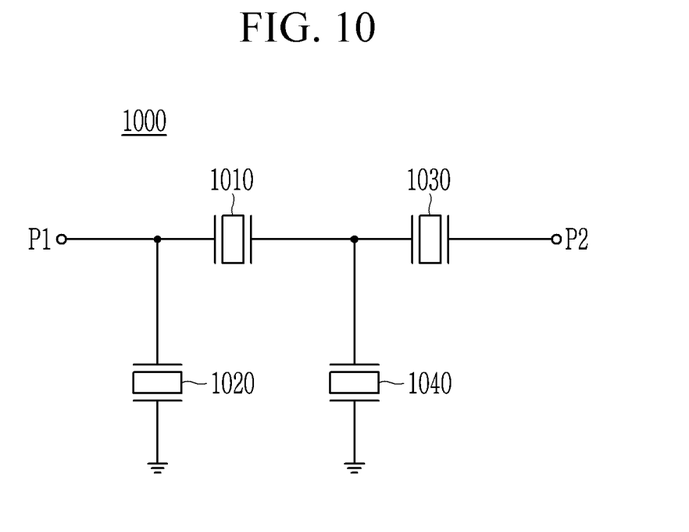
FIG. 10 is a circuit diagram showing the acoustic wave filter of the comparative example.

In FIGS. 7 to 9, the comparative example S710 is a two-stage ladder filter shown in FIG. 10.

FIG. 10 is a circuit diagram showing the acoustic wave filter of the comparative example.

As shown in FIG. 10, the acoustic wave filter 1000 of the comparative example S710 has a structure in which a ladder filter consisting of a series resonator 1010 and a shunt resonator 1020 is connected to a ladder filter consisting of a series resonator 1030 and a shunt resonator 1040, and has a structure in which the bandpass filters 130a, 130b, 150a, and 150b are not present in the acoustic wave filter 600 of FIG. 6.

Referring to FIG. 7, it may be seen that the embodiment S720 shown in FIG. 6 has a better frequency rejection characteristic outside a pass band than the comparative example S710 because of the bandpass filters 130a, 130b, 150a, and 150b.

Referring to FIG. 8, it may be seen that a pass bandwidth of the embodiment S720 shown in FIG. 6 is wider than that of the comparative example S710 because of the bandpass filters 130a, 130b, 150a, and 150b.

In addition, referring to FIG. 9, it may be seen that the embodiment S720 shown in FIG. 6 has a lower reflection loss in the pass band than the comparative example S710 because of the bandpass filters 130a, 130b, 150a, and 150b.

Thus, the acoustic wave filter 600 shown in FIG. 6 may connect the first bandpass filter 130a and the second bandpass filter 130b to both terminals of the first ladder filter 110a and may connect the bandpass filters 150a and 150b to both terminals of the second ladder filter 110b so that it has a wide bandwidth, a low insertion loss in the pass band, and a high rejection characteristic in a cutoff band.

In addition, when FIGS. 7 to 9 are compared with FIGS. 2 to 4, the acoustic wave filter 600, in which the ladder filters are connected, has a better high rejection characteristic in the cutoff band, a better skirt characteristic, and a lower reflection loss in the pass band than the acoustic wave filter 100 shown in FIG. 1.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. An acoustic wave filter comprising:
   a first ladder filter, connected between a first port and a second port, comprising a first series resonator and a first shunt resonator;
   a first filter, connected between the first port and a first terminal of the first ladder filter, comprising a first inductor and a first capacitor connected in series to each other; and
   a second filter, connected between a second terminal of the first ladder filter and the second port, comprising a second inductor and a second capacitor connected in series to each other,
   wherein the first inductor and the second inductor have mutual inductance with each other.

2. The acoustic wave filter of claim 1, wherein each of the first filter and the second filter includes a bandpass filter.

3. The acoustic wave filter of claim 1, wherein the first series resonator and the first shunt resonator have a piezoelectric characteristic, and the acoustic wave filter includes a bulk acoustic wave filter.

4. The acoustic wave filter of claim 1, further comprising:
   a second ladder filter, connected between the first ladder filter and the second port, comprising a second series resonator and a second shunt resonator;
   a third filter, connected between the second terminal of the first ladder filter and a first terminal of the second ladder filter, comprising a third inductor and a third capacitor connected in series to each other; and
   a fourth filter, connected between a second terminal of the second ladder filter and the second port, comprising a fourth inductor and a fourth capacitor connected in series to each other.

5. The acoustic wave filter of claim 4, wherein the third inductor and the fourth inductor have mutual inductance with each other.

6. An acoustic wave filter comprising:
   a first series resonator connected between a first port and a second port;
   a first shunt resonator connected between a first node, disposed between the first port and the second port, and a ground;
   a first bandpass filter, comprising a first inductor and a first capacitor connected in series to each other between the first port and the first series resonator; and
   a second bandpass filter, comprising a second inductor and a second capacitor connected in series to each other between the first series resonator and the second port.

7. The acoustic wave filter of claim 6, wherein the first inductor and the second inductor have mutual inductance with each other.

8. The acoustic wave filter of claim 7, further comprising:
   a second series resonator connected between the first series resonator and the second port;
   a second shunt resonator, connected between a ground and a second node, disposed between the second bandpass filter and the second port;
   a third bandpass filter, comprising a third inductor and a third capacitor connected in series to each other between the second bandpass filter and the second node; and
   a fourth bandpass filter comprising a fourth inductor and a fourth capacitor connected in series to each other between the second series resonator and the second port.

9. The acoustic wave filter of claim 8, wherein the third inductor and the fourth inductor have mutual inductance with each other.

10. An acoustic wave filter comprising:
    a plurality of filters connected between a first port and a second port, wherein each of the plurality of filters comprises an inductor and a capacitor connected in series to each other;
    a plurality of ladder filters connected between the first port and the second port, wherein each of the plurality of ladder filters comprises a series resonator and a shunt resonator, and each of the plurality of ladder filters is connected between different adjacent ones of the plurality of filters; and
    each terminal of terminals of the plurality of filters is connected to one of the first port, the second port, a terminal of one of the plurality of ladder filters, or a terminal of an adjacent one of the plurality of filters,
    wherein each of the plurality of filters includes a bandpass filter.

11. The acoustic wave filter of claim 10, wherein the series resonator and the shunt resonator have a piezoelectric effect.

12. The acoustic wave filter of claim 10, wherein the acoustic wave filter is a bulk acoustic wave (BAW) filter.

13. The acoustic wave filter of claim 10, wherein mutual inductance exist between inductors of adjacent ones of the plurality of filters.

* * * * *